United States Patent
Morgenshtein

(10) Patent No.: US 7,336,104 B2
(45) Date of Patent: Feb. 26, 2008

(54) MULTIPLE-OUTPUT TRANSISTOR LOGIC CIRCUIT

(75) Inventor: Arkadiy Morgenshtein, Kiryat-Motzkin (IL)

(73) Assignee: Technion Research & Development Foundation Ltd., Haifa (IL)

( * ) Notice: Subject to any disclaimer, the term of this patent is extended or adjusted under 35 U.S.C. 154(b) by 151 days.

(21) Appl. No.: 11/166,248

(22) Filed: Jun. 27, 2005

(65) Prior Publication Data

US 2005/0285630 A1 Dec. 29, 2005

Related U.S. Application Data

(60) Provisional application No. 60/582,829, filed on Jun. 28, 2004.

(51) Int. Cl.
*H03K 19/20* (2006.01)
*H03K 19/094* (2006.01)

(52) U.S. Cl. .................. 326/121; 326/112; 326/119

(58) Field of Classification Search ........ 326/112–114, 326/119, 121
See application file for complete search history.

(56) References Cited

U.S. PATENT DOCUMENTS

| | | | | |
|---|---|---|---|---|
| 4,367,420 A | * | 1/1983 | Foss et al. ................ | 326/119 |
| 4,620,117 A | * | 10/1986 | Fang ........................ | 326/113 |
| 4,968,903 A | * | 11/1990 | Smith et al. .............. | 326/50 |
| 5,479,107 A | * | 12/1995 | Knauer ..................... | 326/17 |
| 6,040,717 A | * | 3/2000 | Fried ........................ | 326/113 |
| 6,232,799 B1 | * | 5/2001 | Allen et al. .............. | 326/113 |
| 6,252,426 B1 | * | 6/2001 | Fulkerson ................. | 326/113 |
| 6,407,587 B1 | * | 6/2002 | Piguet ...................... | 326/121 |
| 6,621,305 B2 | * | 9/2003 | Nakagawa et al. ........ | 326/98 |
| 2002/0089353 A1 | * | 7/2002 | Bellaouar ................. | 326/115 |

* cited by examiner

*Primary Examiner*—Rexford Barnie
*Assistant Examiner*—Dylan Whtie

(57) ABSTRACT

A logic circuit consists of a first transistor network and a complementary second transistor network connected at a central node. The central node serves as a first logic output. Each of the transistor networks is also connected to a respective root. A third transistor network is connected between an intermediate node of one of the transistor networks and the network's respective root. For a homogeneous graft, the third transistor network has a complementary structure to the transistors between the intermediate node and the central node, is of the same transistor type as the given transistor network, and has inverted inputs relative to the transistors between the intermediate node and the central node. The third transistor network (the graft network) provides a second logic output to the logic circuit.

26 Claims, 15 Drawing Sheets

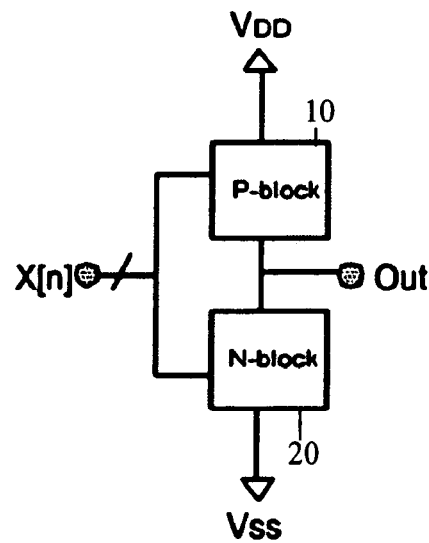
Figure 1a – Prior Art
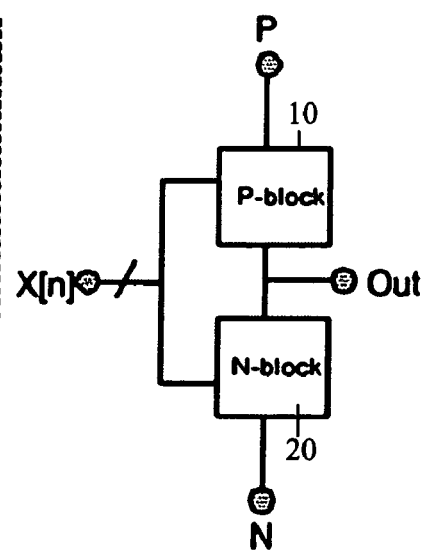
Figure 1b – Prior Art

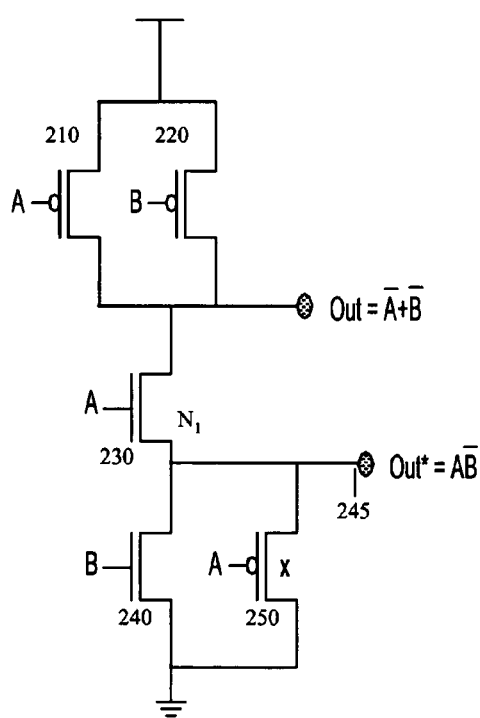 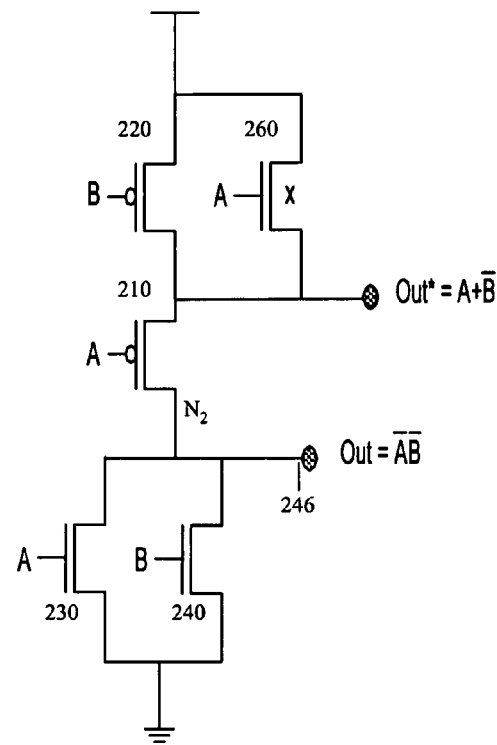
Figure 2a                    Figure 2b

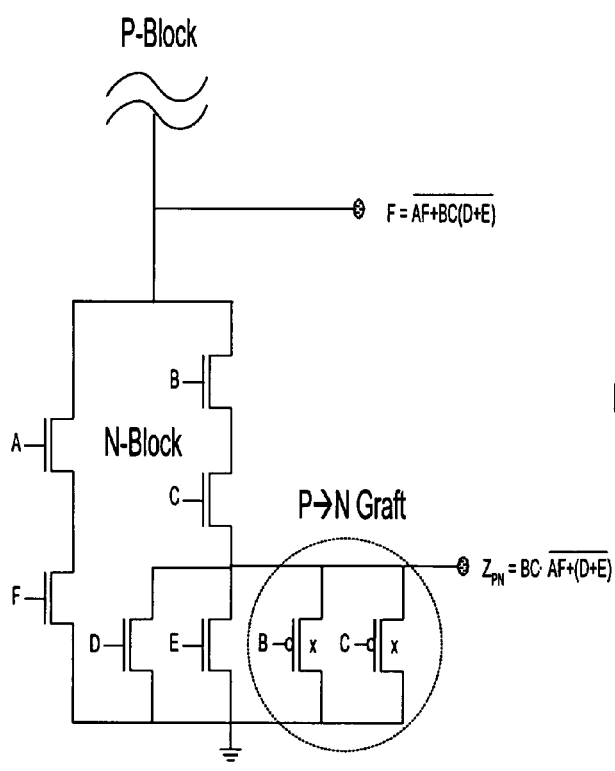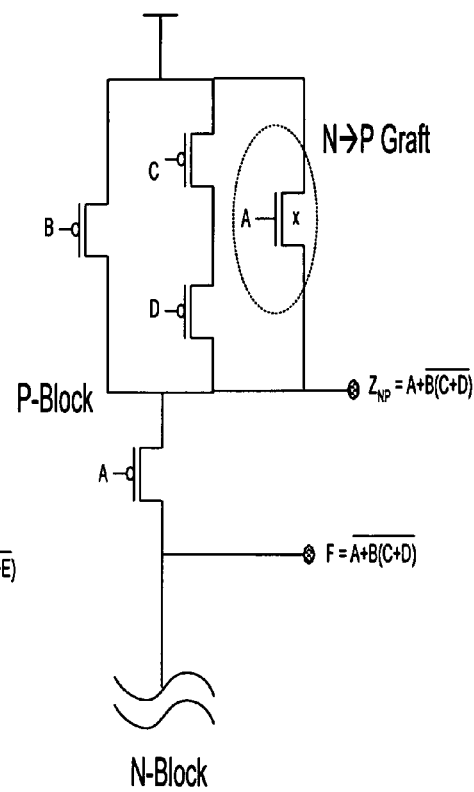
Figure 3a                    Figure 3b

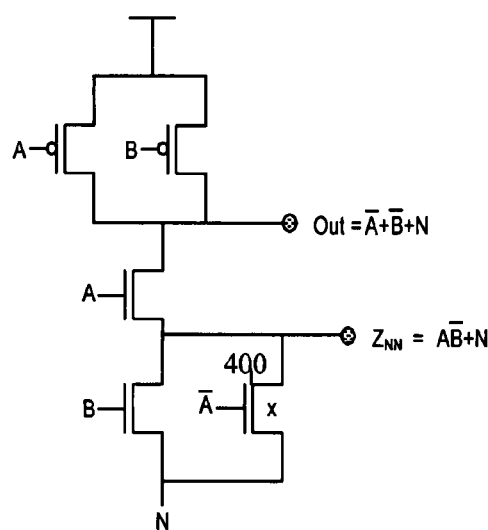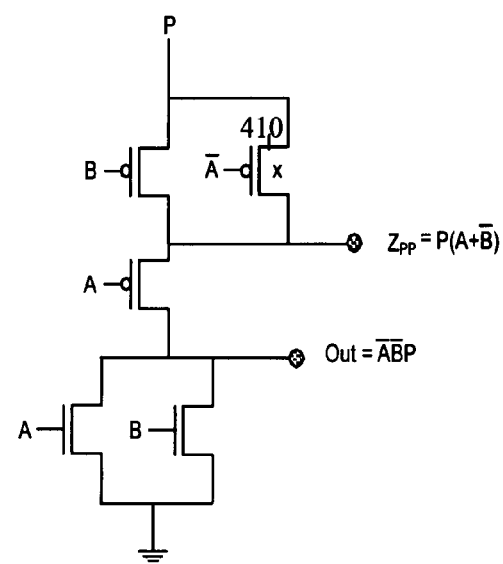
Figure 7aFigure 7b

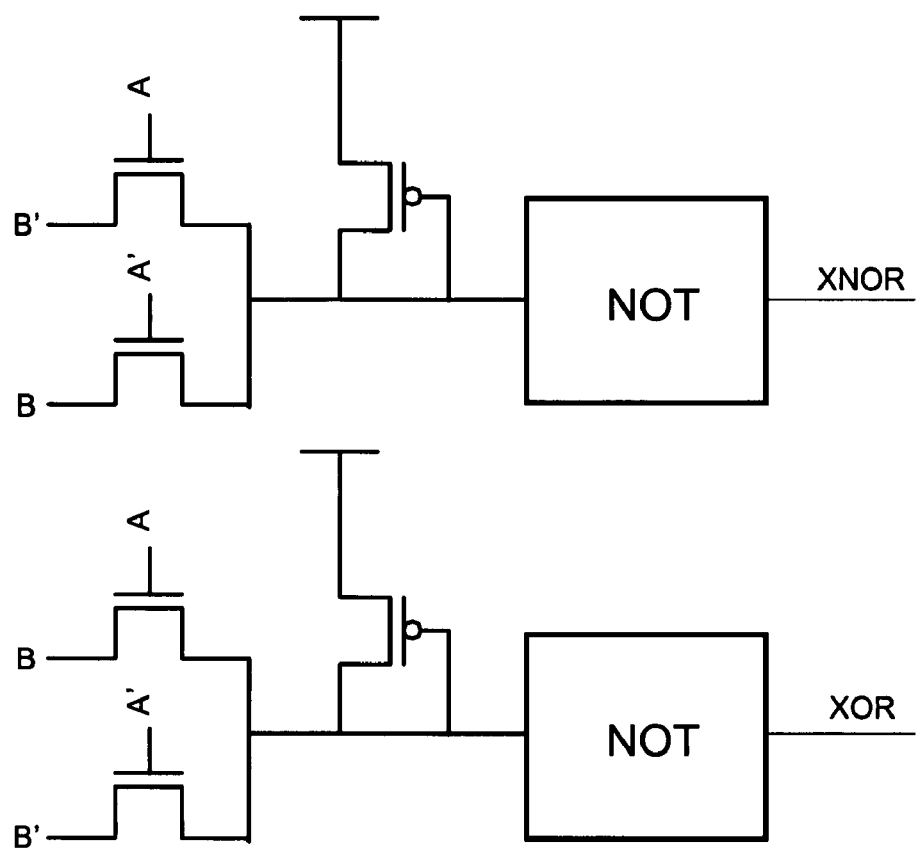
Figure 10b – Prior art

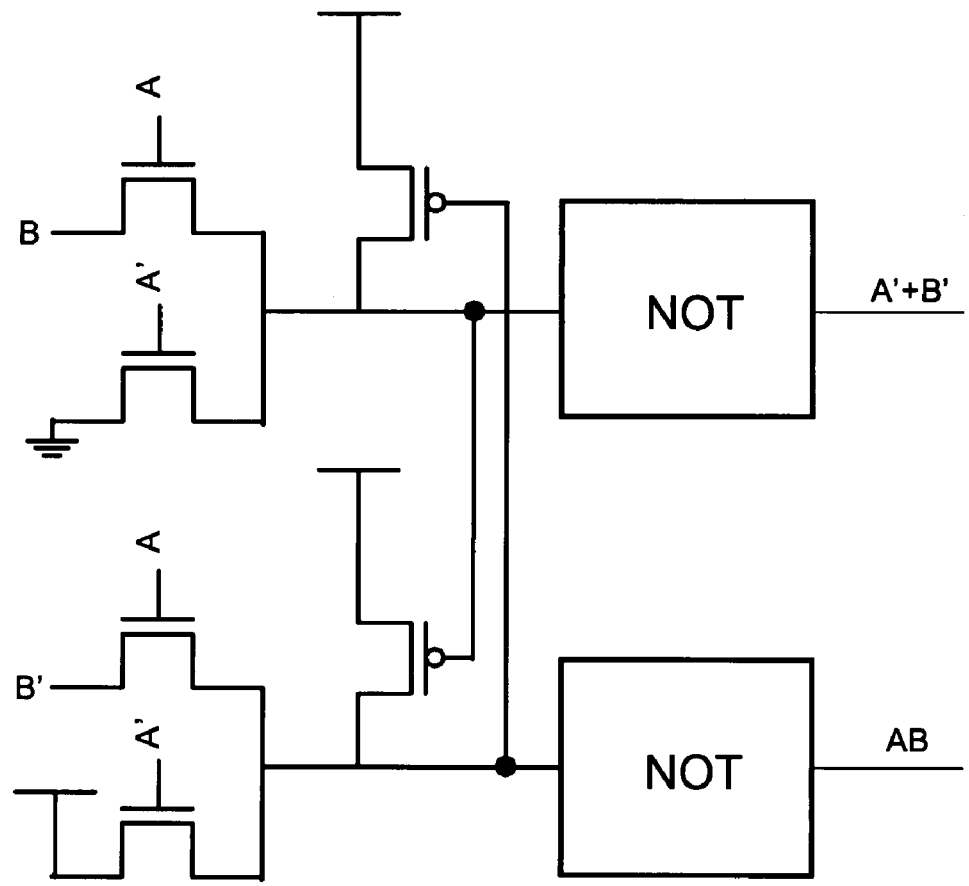
Figure 10c – Prior art

MULTIPLE-OUTPUT TRANSISTOR LOGIC CIRCUIT

RELATED APPLICATIONS

This application claims the benefit of U.S. Application No. 60/582,829, filed 28 Jun. 2004, which is herein incorporated in its entirety by reference.

FIELD AND BACKGROUND OF THE INVENTION

The present invention relates to a transistor logic circuit with multiple outputs and, more particularly but not exclusively, to connecting transistors to an intermediate node of a transistor logic circuit in order to implement additional logic functions.

The demand for low area and low power consumption are among the main issues in modem digital VLSI design. The advances of portable and consumer electronics are driving a need for new design technologies, which can achieve an alternative or improved design technique to standard Complementary Metal Oxide Semiconductor (CMOS) design. FIG. 1a shows a generalized structure of a logic function implemented in standard CMOS architecture. The logic function is implemented by two complementary transistor networks, the P-block 10 (which consists of p-type transistors) and the N-block 10 (which consists of n-type transistors). The two blocks are connected at a central node. One or more of the transistor inputs serve as logic inputs, X[n], while the central node serves as the logic output, OUT. In addition, each transistor network is connected to a respective root, where the root of P-block 10 is $V_{DD}$ (a high voltage, for example the positive supply voltage), and the root of N-block 20 is $V_{SS}$ (a low voltage, for example the negative supply voltage or ground).

One of the main drawbacks of standard complementary CMOS design structures is transistor redundancy. In standard CMOS architecture, complementary p-block and n-block arrangements of transistors are implemented in order to obtain a single logic function. All the transistors in the complementary CMOS structure are dedicated to implementation of the single logical function that is manifested in its output. The only node that is used as the output function is the central interconnection node of the n-block and p-block, while no use is made of the intermediate nodes.

The complementary structure of current CMOS architecture therefore results in a logic circuit which is inefficient in terms of transistor use, and, consequently, with high area and power requirements. In the following, parts that are the same as those in previous figures are given the same reference numerals and are not described again except as necessary for an understanding of the present embodiment.

U.S. pat. appl. No. 2004/0130349 of the present inventor, which is hereby incorporated by reference, presents a generalization of complementary CMOS architecture which is denoted Gate Diffusion Input (GDI) architecture. FIG. 1b shows a generalized structure of a logic function implemented in GDI architecture. As seen in FIG. 1b, in GDI the n-input CMOS structure is extended to an (n+2)-input GDI cell by introducing an input P instead of $V_{DD}$ in the P-block of the CMOS structure and an input N instead of $V_{SS}$ in the N-block.

The extended GDI implementation can be represented by the following logic expression:

$$\text{Out} = \overline{F}(x_1 \ldots x_n) * N + F(x_1 \ldots x_n) * P \quad (1)$$

where $F(x_1 \ldots x_n)$ is the original output of CMOS circuit.

As can be seen, CMOS is a private case of GDI circuit in which N=Gnd ('0') and P=Vdd ('1'). Like CMOS architecture, transistor use in general GDI architecture is inefficient. GDI consequently suffers from the same disadvantages.

There is thus a widely recognized need for, and it would be highly advantageous to have, a transistor logic circuit architecture devoid of the above limitations.

SUMMARY OF THE INVENTION

According to a first aspect of the present invention there is provided a logic circuit comprising a first, a second and a third transistor network. The first and second transistor networks have a complementary structure, and are connected at a central node to provide a first logic output, each of the first and the second transistor networks being further connected to a respective root. The third transistor network is connected between an intermediate node of a given one of the transistor networks and the respective root of the given transistor-network. The third transistor network has a complementary structure to the transistors between the intermediate node and the central node, and is of the opposite transistor type as the given transistor network, and has equivalent inputs relative to the transistors between the intermediate node and the central node. Thus a second logic input is provided.

According to a second aspect of the present invention there is provided a logic circuit comprising a first, a second and a third transistor network. The first and second transistor networks have a complementary structure, and are connected at a central node to provide a first logic output, each of the first and the second transistor networks being further connected to a respective root. The third transistor network is connected between an intermediate node of a given one of the transistor networks and the respective root of the given transistor network. The third transistor network has a complementary structure to the transistors between the intermediate node and the central node, and is of the same transistor type as the given transistor network, and has inverted inputs relative to the transistors between the intermediate node and the central node. Thus a second logic input is provided.

According to a third aspect of the present invention there is provided method for designing a logic circuit. First a first logic function is implemented as a first transistor network and a complementary second transistor network connected at a central node. The central node serves as a first logic output, and each of the first and the second transistor networks are further connected to a respective root. Next an intermediate node in the first transistor network is selected. A logical path from the intermediate node to the central node is then determined. A third transistor network is implemented, having a complementary structure to the transistors in the determined path. The transistors in the third transistor network are of the opposite transistor type as the first network, and have equivalent inputs relative to the transistors in the determined path. Finally, the third transistor network is placed between the intermediate node and the root of the first transistor network.

According to a fourth aspect of the present invention there is provided method for designing a logic circuit. First a first logic function is implemented as a first transistor network and a complementary second transistor network connected at a central node. The central node serves as a first logic output, and each of the first and the second transistor networks are further connected to a respective root. Next an intermediate node in the first transistor network is selected.

A logical path from the intermediate node to the central node is then determined. A third transistor network is implemented, having a complementary structure to the transistors in the determined path. The transistors in the third transistor network are of the same transistor type as the first network, and have inverted inputs relative to the transistors in the determined path. Finally, the third transistor network is placed between the intermediate node and the root of the first transistor network.

According to a fifth aspect of the present invention there is provided method for providing a logic circuit. A logic circuit design is obtained by performing the following steps. First a first logic function is implemented as a first transistor network and a complementary second transistor network connected at a central node. The central node serves as a first logic output, and each of the first and the second transistor networks are further connected to a respective root. Next an intermediate node in the first transistor network is selected. A logical path from the intermediate node to the central node is then determined. A third transistor network is implemented, having a complementary structure to the transistors in the determined path. The transistors in the third transistor network are of the opposite transistor type as the first network, and have equivalent inputs relative to the transistors in the determined path. The final step in obtaining the logic circuit design is placing the third transistor network between the intermediate node and the root of the first transistor network. Once the logic circuit design is obtained, p-type and n-type transistors are provided, and connected in accordance with the circuit design.

According to a sixth aspect of the present invention there is provided method for providing a logic circuit. A logic circuit design is obtained by performing the following steps. First a first logic function is implemented as a first transistor network and a complementary second transistor network connected at a central node. The central node serves as a first logic output, and each of the first and the second transistor networks are further connected to a respective root. Next an intermediate node in the first transistor network is selected. A logical path from the intermediate node to the central node is then determined. A third transistor network is implemented, having a complementary structure to the transistors in the determined path. The transistors in the third transistor network are of the same transistor type as the first network, and have inverted inputs relative to the transistors in the determined path. The final step in obtaining the logic circuit design is placing the third transistor network between the intermediate node and the root of the first transistor network. Once the logic circuit design is obtained, p-type and n-type transistors are provided, and connected in accordance with the circuit design.

The present invention successfully addresses the shortcomings of the presently known configurations by providing a logic circuit based on a standard complementary structure, and having an additional transistor network attached to an intermediate node of one of the complementary logic blocks. The additional transistor network provides an additional logic output, which implements a new logic function without affecting the original logic output of the complementary structure, and does not create interfering conduction paths. A multiple-output logic circuit is thus obtained, with the addition of a relatively small number of transistors.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

Implementation of the method and system of the present invention involves performing or completing selected tasks or steps manually, automatically, or a combination thereof. Moreover, according to actual instrumentation and equipment of preferred embodiments of the method and system of the present invention, several selected steps could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method and system of the invention could be described as being performed by a data processor, such as a computing platform for executing a plurality of instructions.

BRIEF DESCRIPTION OF THE DRAWINGS

The file of this patent contains at least one drawing executed in color photograph. Copies of this patent with color photograph(s) will be provided by the Patent and Trademark Office upon request and payment of necessary fee.

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIGS. 1a and 1b are simplified block diagrams of prior art logic circuits with complementary CMOS and GDI architectures respectively.

FIG. 1c is a simplified block diagram of a logic circuit, according to a preferred embodiment of the present invention.

FIGS. 2a and 2b are graft logic circuit diagrams of a NAND2 and a NOR2 dual-output logic circuit respectively, each having a single-transistor nonhomogeneous graft block, according to preferred embodiments of the present invention.

FIGS. 3a and 3b are circuit diagrams of graft logic circuits, with the graft block connected to a CMOS block having 6 and 4 logic inputs respectively, according to preferred embodiments of the present invention.

Figure 4A:
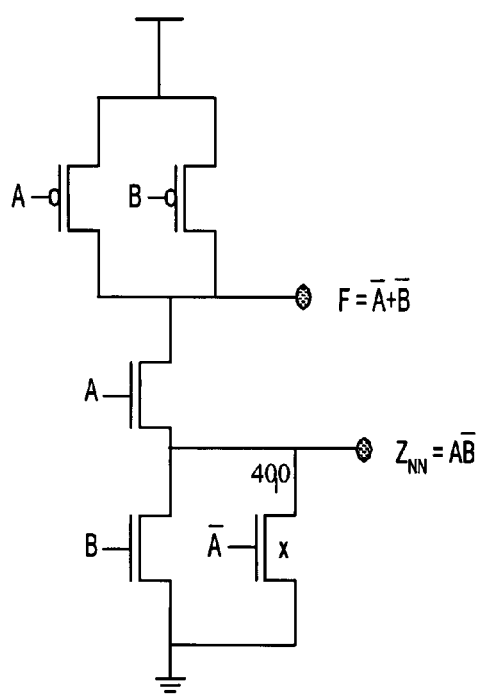
Figure 4B:
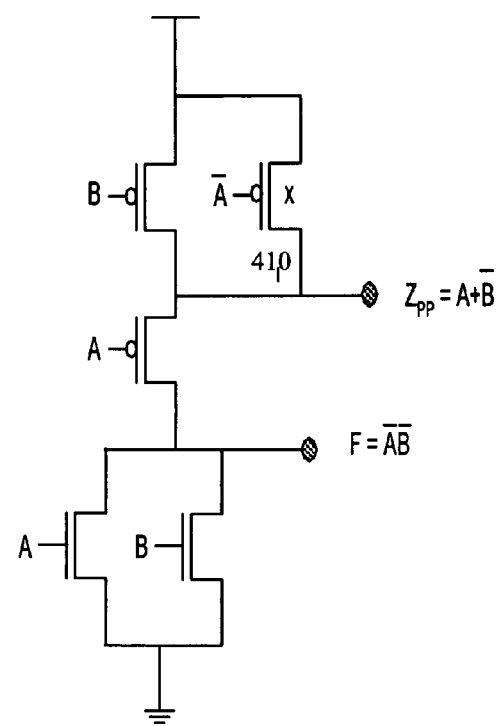

FIGS. 4a and 4b are circuit diagrams of single-transistor homogeneous grafts in CMOS structures (for N→N and P→P grafts respectively), according to preferred embodiments of the present invention.

Figure 5:
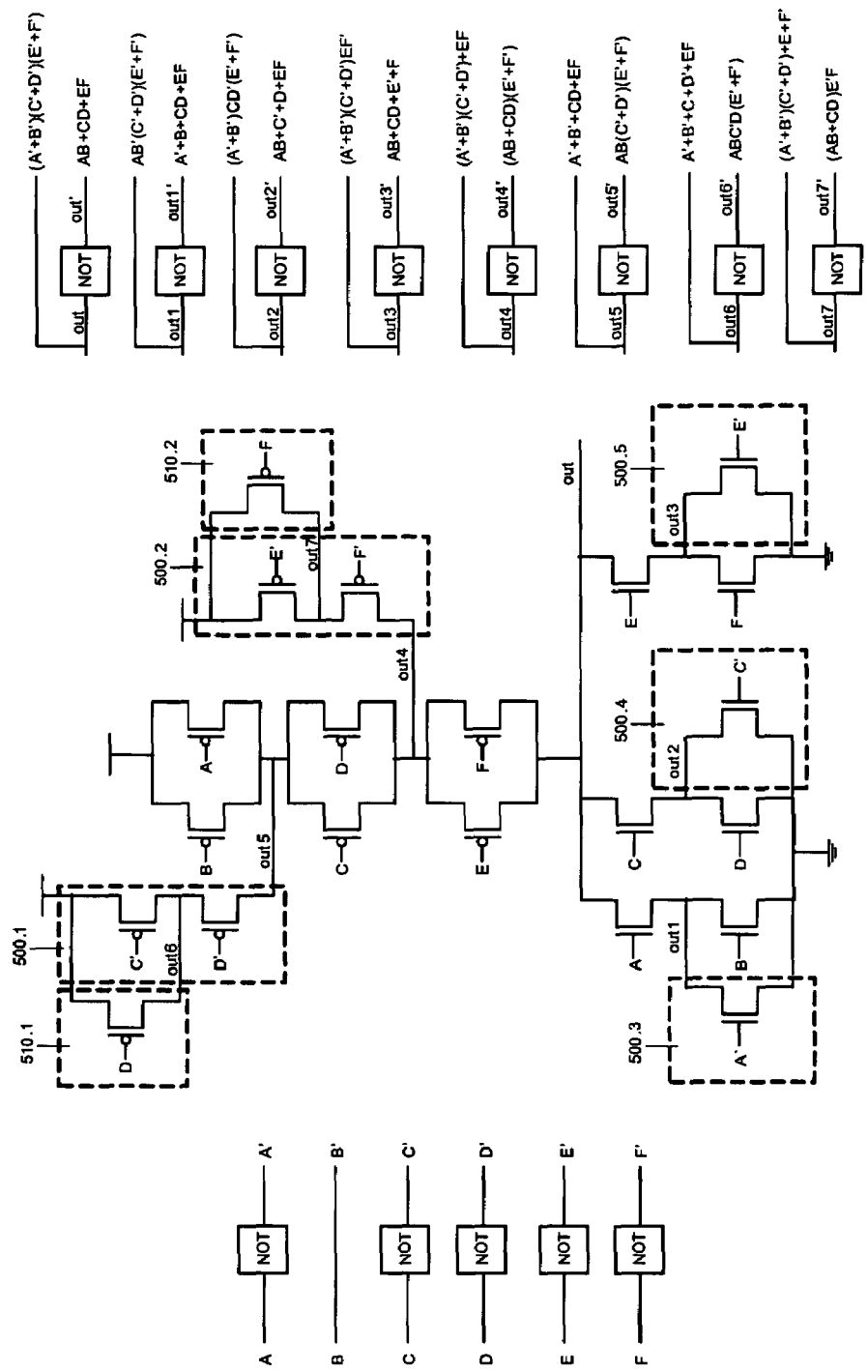

FIG. 5 is a simulator screen print of a logic circuit diagram having primary and secondary graft networks, according to a preferred embodiment of the present invention.

Figure 6:
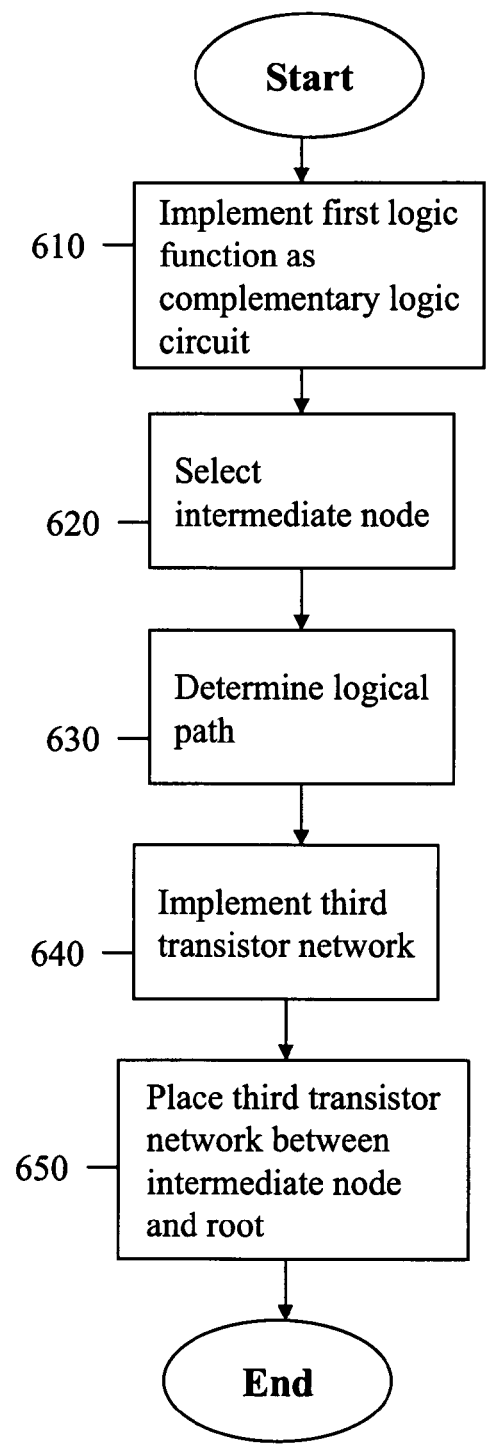

FIG. 6, which is a simplified flowchart of a method for designing a logic circuit, according to a preferred embodiment of the present invention.

FIGS. 7a and 7b are circuit diagrams of single-transistor homogeneous grafts in GDI structures (for N→N and P→P grafts respectively), according to preferred embodiments of the present invention.

Figure 8:
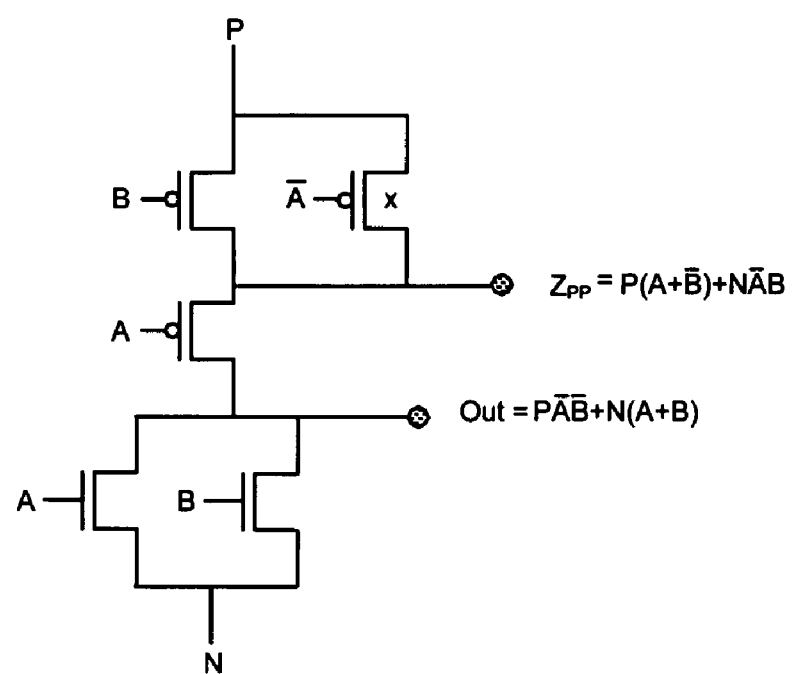

FIG. 8 is a circuit diagram of a homogeneous P-graft GDI logic circuit, according to a preferred embodiment of the present invention.

Figure 9:
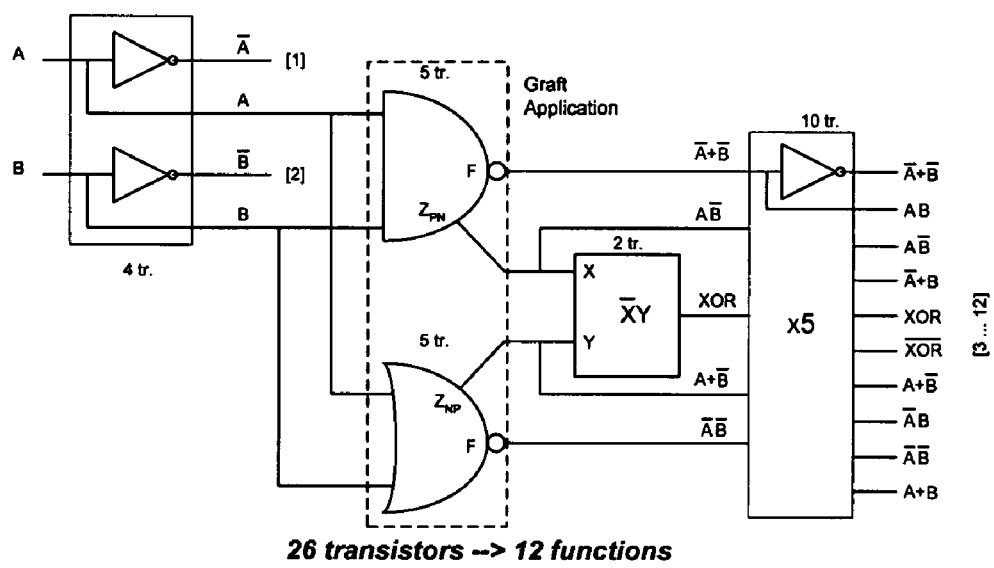

FIG. 9 is a circuit diagram of a 2-input look-up table (LUT) in Graft Logic design, according to a preferred embodiment of the present invention.

Figure 10A:
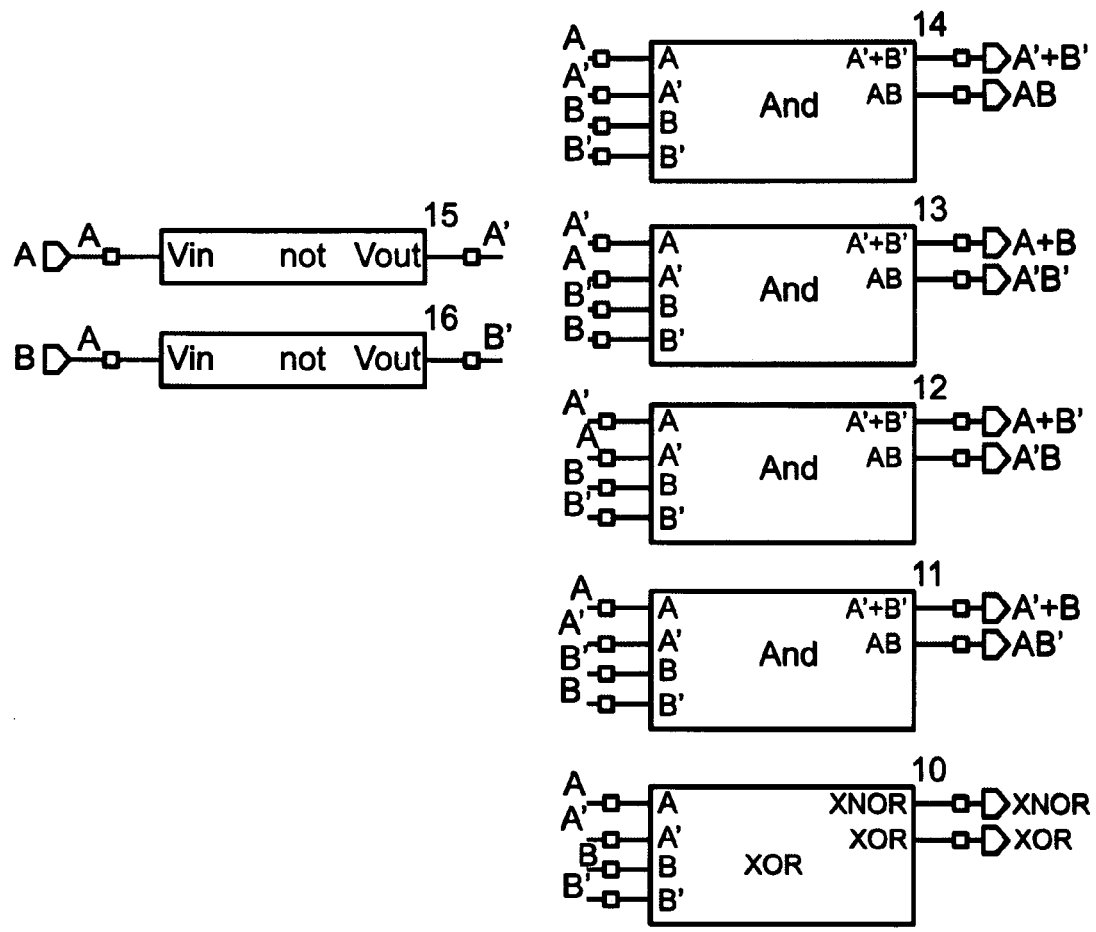

FIG. 10a is a simulator screen print of a logic circuit diagram of a prior art 2-input LUT in CPL (Complementary Pass Logic) design.

FIG. 10b is a simulator screen print of a logic circuit diagram of a prior art XOR gate in CPL (Complementary Pass Logic) design.

FIG. 10c is a simulator screen print of a logic circuit diagram of a prior art 2-input AND gate in CPL (Complementary Pass Logic) design.

Figure 11:
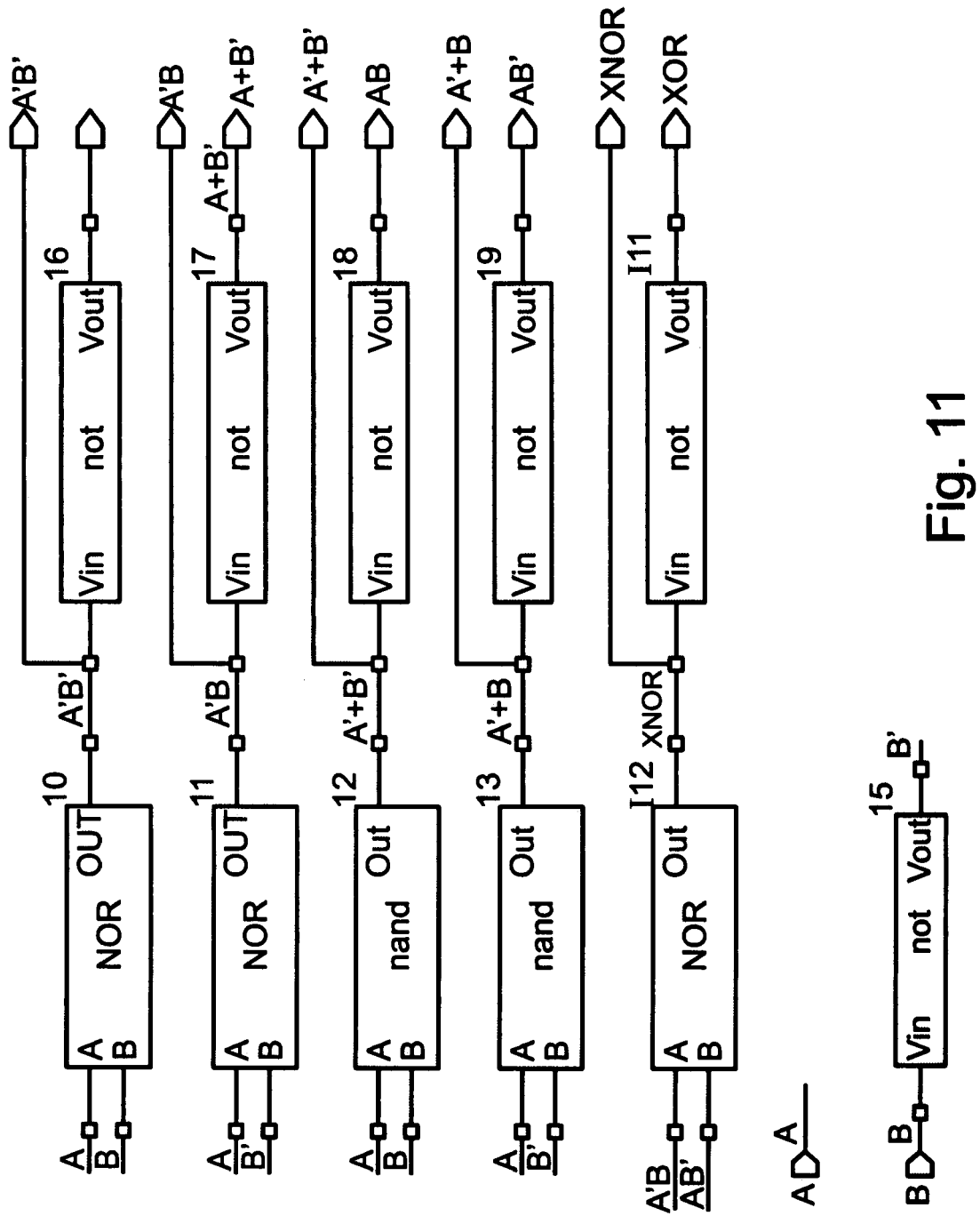

FIG. 11 is a circuit diagram of a prior art 2-input LUT in standard CMOS design.

Figure 12:
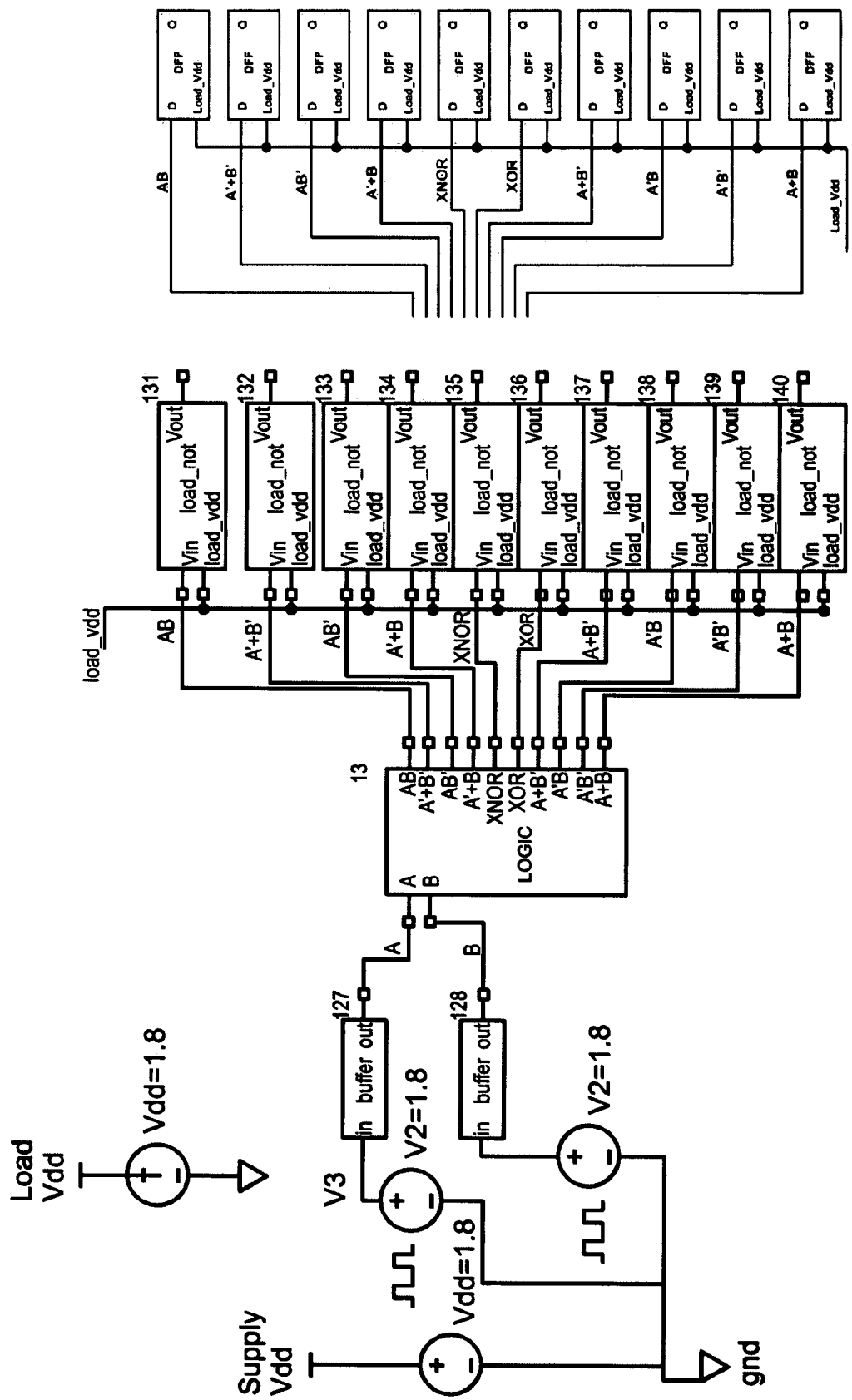

FIG. 12 shows the test setup for comparison testing of the 2-input LUT, in Graft Logic, CPL, and CMOS design technologies.

DESCRIPTION OF THE PREFERRED EMBODIMENTS

The present invention is of a logic circuit which provides multiple logic outputs. Specifically, the present invention utilizes an intermediate node in the p-block or n-block of a logic circuit having a standard CMOS design to provide an additional logic output.

The present invention is a novel methodology of low-area high-performance digital design (denoted herein Graft Logic). Graft Logic improves upon standard CMOS logic design by utilizing internal nodes of given CMOS structures to implement multiple logic functions within the CMOS-based monolithic transistor structure. New and complex logic functions are achieved by inserting a small number of additional transistors into existing CMOS structures. In this way a monolithic transistor structure is created with numerous logic outputs, instead of a single output as in standard CMOS logic structure. As the resulting circuit is formed by the addition of a relatively small number of transistors, a multiple-output logic circuit is provided within a low area.

The principles and operation of a digital logic circuit according to the present invention may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Graft Logic design is based on the use of single or multiple transistor blocks (denoted herein graft blocks), which are inserted into the original CMOS structure to create additional signal paths for outputting a new logic function. The graft block may be either nonhomogeneous or homogeneous. A nonhomogeneous graft block consists of either p-type transistors inserted into the logic circuit's n-block or n-type transistors inserted into the logic circuit's p-block. A homogeneous graft block consists of either p-type transistors inserted into the logic circuit's p-block or n-type transistors inserted into the logic circuit's n-block.

The present invention is based on logic circuits with a standard complementary CMOS design. However, the invention is suitable for many transistor fabrication technologies, including CMOS, silicon on insulator (SOI), silicon on sapphire (SOS) etc.

Graft Logic design ensures that the resulting logic circuit is never in a state that brings the original function to an undesired value. As shown below, the structure of the graft network ensures that the graft network operates only when concurrent transistors that have inputs corresponding to the original function are disconnected (and vice versa).

Figure 1C:
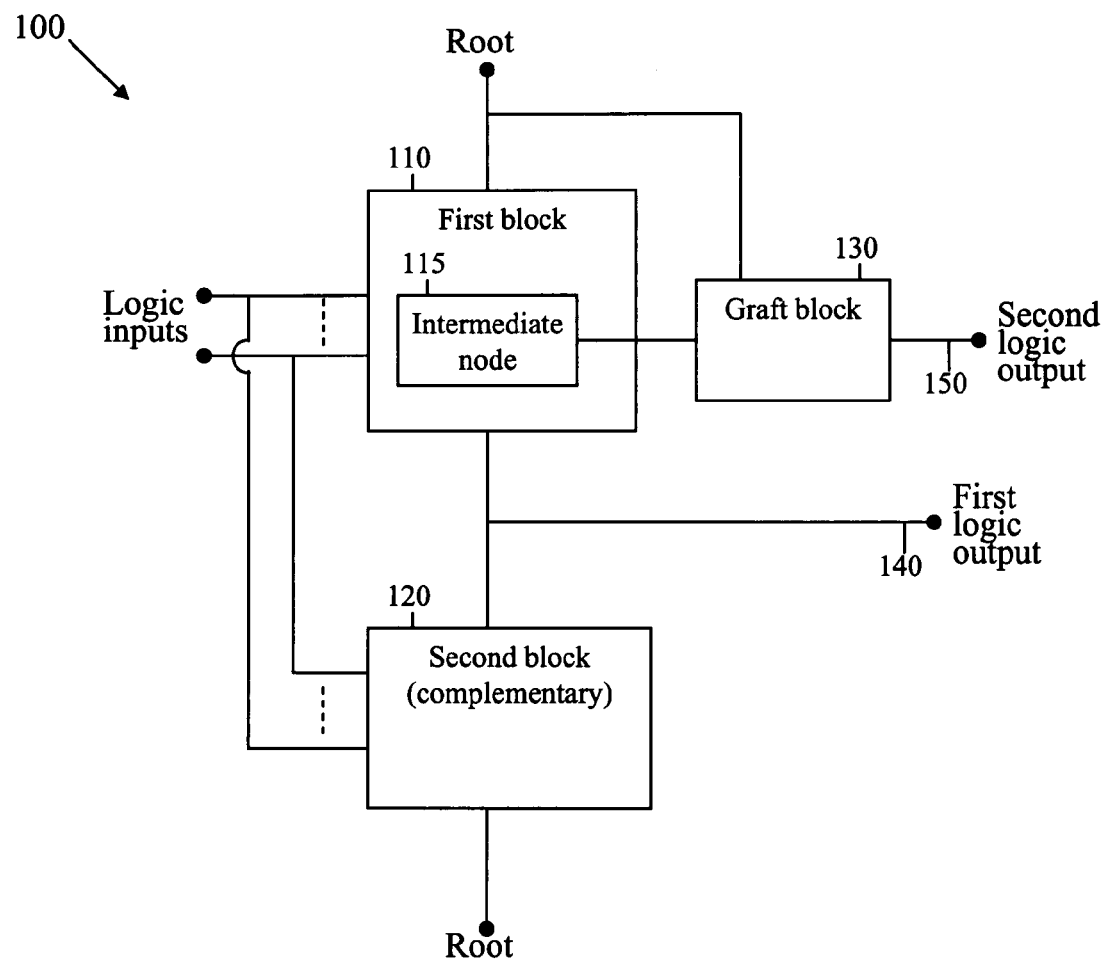

Reference is now made to FIG. 1c, which is a simplified block diagram of a logic circuit according to a preferred embodiment of the present invention. Logic circuit 100 consists of three transistor networks: first transistor network 110 (denoted herein first block), second transistor network 120 (denoted herein second block), and a third transistor network 130 (denoted herein graft block or graft network). First block 110 and second block 120 are designed to implement a logic function by standard complementary CMOS design techniques. That is, first block 110 and second block 120 are of different transistor types, and with a complementary transistor structure. The two networks are connected at a central node, which forms the first logic output 140. First logic output 140 thus provides the logic function implemented by the standard CMOS structure. Additionally, each transistor network is connected to a respective root. In a first preferred embodiment based on a complementary CMOS architecture, the root of the p-block (i.e. the transistor network formed of p-type transistors) is $V_{DD}$, and the root of the n-block is $V_{SS}$. In a second preferred embodiment based on GDI architecture, the root of the p-block is logic input P, and the root of the n-block is logic input N.

The following discussion is directed to the first preferred embodiment of a multiple-output transistor logic circuit, which is based upon complementary CMOS architecture. The extension of the multiple-output transistor logic circuit to GDI is then presented.

Graft block 130 is a transistor network connected between an intermediate node 115 of first block 110 and its root, where first block 110 may consist of either the p-type transistor network or the n-type transistor network. The graft block may be either nonhomogeneous or homogeneous. In the case of nonhomogeneous graft logic, graft block 130 is formed of transistors of the opposite type to those forming first block 110. For example, if first block 110 is a p-type transistor network, graft block 130 is a network of n-type transistors connected between the intermediate node and $V_{DD}$. The transistors of graft block 130 are arranged in a complementary structure and have equivalent inputs (i.e. non-inverted) to the transistors of the first-block, which are located between intermediate node 115 and central node 140. The output of graft block 130 serves as a second logic output, thus implementing a second known logic function.

Then new function formed by the nonhomogeneous graft is given by the following expressions:

$$P \rightarrow N \text{ graft (p-type graft into n-block): } Z_{PN} = F \cdot (\text{graft}=1) \quad (2)$$

$$N \rightarrow P \text{ graft (n-type graft into p-block): } Z_{NP} = \text{graft} + F \cdot (\text{graft}=0) \quad (3)$$

where $Z_{NP}$ (or $Z_{NP}$) is the new output, graft is the function created by the inputs and transistors in the grafted block (e.g. two serial transistors with inputs A and B will give graft=A*B), and F is the logic function implemented at the original logic output. F(graft=X) is the output function in which the expression of the graft logic function (e.g. A*B) is equal to X. For example, if F=A*B+C*$\overline{D}$ then:

$$F(\text{graft}=0)=F(A*B=0)=0+C*\overline{D}=C*\overline{D}$$

FIGS. 2a and 2b are circuit diagrams of single-transistor nonhomogeneous graft blocks, according to preferred embodiments of the present invention. FIG. 2a shows a p-type graft inserted into the N-block of a NAND2 logic circuit, and FIG. 2b shows an n-type graft inserted into the P-block of a NOR2 logic circuit. In each case the resulting circuit has an additional logic output which implements a new logic function. (Note that an assembly of all 4 functions with 2 output inverters is a 2-4 Decoder. In Graft Logic design 14 transistors are required, as compared to 20 transistors in standard CMOS design.)

In both FIGS. 2a and 2b the two transistors of the p-block are numbered 210 and 220, and the two transistors of the n-block are numbered 230 and 240. FIG. 2a shows a graft block inserted between node $N_1$ and $V_{SS}$. Between node $N_2$ and central node 245 is a single n-type transistor 230 with input A. Therefore the nonhomogeneous graft block in this case is a single p-type transistor 250 with input A. FIG. 2b shows a graft block inserted between node $N_2$ and $V_{DD}$. Between node $N_2$ and central node 246 is a single p-type transistor 210 with input A. Therefore the nonhomogeneous graft block in FIG. 2b is a single n-type transistor 260 with input A.

Graft logic architecture can be applied to more complex CMOS blocks, as shown in FIGS. 3a and 3b. Note that the resulting complex logic functions $Z_{PN}$ and $Z_{NP}$ are created by adding very few transistors (1 or 2 respectively) to the original complementary structure.

Graft logic design can also be achieved with a homogeneous graft, where the graft transistors are of the same type as the block in which they are inserted but with inverted inputs. Like in the nonhomogeneous case, the graft network has a complementary structure relative to the transistor structure between the intermediate and central nodes. For example, consider a NOR3 function in standard CMOS design, having inputs in the P-block going down from $V_{DD}$ in the order of A->B->C in the original function. In order to implement a Graft between the A and B transistors, we create a structure of p-type transistors with a complementary structure to the B and C transistors in the original function. Thus, it will contain two parallel PMOS transistors with inputs $\overline{B}$ and $\overline{C}$.

The homogeneous graft technique eliminates the $V_T$ drop in the new logic output, that may appear during signal transmission through the graft block. FIGS. 4a and 4b are circuit diagrams of examples of single-transistor homogeneous grafts in CMOS structures (for N→N and P→P grafts respectively), according to preferred embodiments of the present invention. Note that the input to the graft block (transistor 400 and 410 respectively) is inverted for both N→N and P→P grafts.

Then new function formed by the homogenous graft is given by the following expressions (given the inverted graft inputs):

N→N graft (n-type graft into n-block): $Z_{NN}=\overline{\text{graft}}*F(\text{graft}=1)$ (4)

P→P graft (p-type graft into p-block): $Z_{PP}=\overline{\text{graft}}+F(\text{graft}=0)$, (5)

where $Z_{NN}$ (or $Z_{PP}$) is the new output, graft is the function created by the inputs and transistors in the grafted block (e.g. two serial transistors with inputs A and B will give graft=A*B), F is the original output, and an overbar indicates inversion (e.g. $\overline{A}$ equals Not(A)). By inverting the inputs to the homogeneous graft we return to the equivalent function obtained by a corresponding nonhomogeneous graft.

$F(\overline{\text{graft}}=X)$ is the output function in which the inverted expression of the graft logic function is equal to X. For example, consider the nonhomogeneous graft created by inserting a p-type transistor with input A into an N-block (graft=A). To form an equivalent homogeneous graft, an n-type transistor with input A' in inserted into the N-block (graft=A'). In this case $F(\overline{\text{graft}}=X)$ is similar to F(A=X), since if graft=A' then $\overline{\text{graft}}$=A.

Transistors forming the three transistor networks discussed above may be of any suitable transistor fabrication technology which provides a transistor capable of operating as a logic switch. In a first preferred embodiment, the transistor networks are formed of CMOS transistors (e.g. p-well, n-well, twin-well). In a second preferred embodiment, the transistor networks are formed of field-effect transistors (FET) (e.g. MOSFET, JFET, TFT). In a third preferred embodiment, the transistor networks are formed of silicon on insulator (SOD) transistors. In a fourth preferred embodiment, the transistor networks are formed of silicon on sapphire (SOS) transistors. In a fifth preferred embodiment, the transistor networks are formed of bipolar transistors.

Preferably the logic circuit contains at least one buffer and/or inverter to stabilize the logic circuit outputs. Inverters may also be added to obtain desired logic functions.

Graft Logic design can be extended to secondary grafts. In a secondary graft, an additional transistor network (a secondary graft block) is inserted into the graft network that is already present in the logic circuit (denoted below the primary graft network). A node is selected in the primary graft network, and a secondary graft transistor network is inserted between the selected node and the root of the primary graft network. The logic thus function obtained and the rules of graft insertion are the same as discussed above, where the second logic output (i.e. the output of the primary graft block) serves the function of the central node. Thus the structure of the secondary graft block is complementary to the transistors along the pathway from the node of the primary graft network to the second logic output. Likewise, the basic logic function (i.e. the F( . . . ) function) is the output logic function of the primary graft network and not the original CMOS output. This concept can be extended to multi-level grafts (triple, etc.).

The structure of the transistor network for secondary (and multi-level) grafts follows the same rules discussed above. A nonhomogeneous graft network is of the opposite transistor type as the primary graft network, and has equivalent inputs relative to the transistors along the pathway from the node of the primary graft network to the second logic output. A homogeneous graft network is of the same transistor type as the primary graft network, and has inverted inputs relative to the transistors along the pathway from the node of the primary graft network to the second logic output.

FIG. 5 is a circuit diagram of a logic circuit with secondary grafts, according to a preferred embodiment of the present invention. Here the basic structure is a 6-input CMOS logic gate. Primary grafts were applied directly to the CMOS structure (500.1 to 500.5) according to the aforementioned principles. Then, additional grafts were inserted (510.1 and 510.2) into the first grafts, using the same rules, but considering the primary graft networks as a basis. Each graft (both primary and secondary) resulted in a very complex new 6-input function. In this way we created 16 different 6-input functions using only 47 transistors (including inverters). The same logical set would require at least 122 transistors in standard CMOS design, and without obtaining the additional performance advantages of graft logic design.

Reference is now made to FIG. 6, which is a simplified flowchart of a method for designing a logic circuit, according to a preferred embodiment of the present invention. In step 610 a logic function is implemented as complementary logic circuit using a complementary logic circuit design technique known in the art. The complementary logic circuit consists of a first transistor network and a complementary second transistor network which are connected at a central node, with the central node serving as a first logic output. The first and the second transistor networks are each connected to a respective root. The first transistor network may be a p-type network with the second transistor network an n-type network or vice versa.

In step 620, an intermediate node is selected in the first transistor network (which is either the n-type or the p-type network, according to the designer's choice). In step 630, the logical path from the intermediate node to the central node is determined. The logical path consists of the transistor structure positioned between the intermediate and central nodes.

In step 640, a third transistor network (the graft block) is implemented with a complementary structure to the transistors in the determined logical path. In a nonhomogeneous graft the third transistor network is of the opposite transistor type as the first network, with equivalent (i.e. non-inverted) inputs relative to the transistors in the determined path. In a homogeneous graft the third transistor network is of the same transistor type as the first network, with inverted inputs relative to the transistors in the determined path.

In step 650, the third transistor network is placed between the intermediate node and the root of the first transistor network, thus forming an additional logic output.

It is noted that the number of transistors needed for the graft block is smaller the closer the chosen node is to the original output (i.e. the central node), as there are fewer transistors in the determined path from the intermediate node to original output. The additional functions generated by adding a graft block to the complementary logic circuit differs for each node, but the total functional complexity (i.e. the number of variables in the new function) remains the same regardless of the location of the graft or of the number of transistors in the graft.

In the preferred embodiment, after the logic circuit design is obtained as discussed for FIG. 6 above, the logic circuit is then provided by providing the transistors required for the logic circuit (both n-type and p-type) and connecting the provided transistors as indicated by the circuit design. Note that the logic circuit contains both n-type and p-type transistors; however the type of each particular transistor in the logic circuit is indicted by the design.

In order to translate the application of Graft from CMOS to GDI one should rewrite the formulation of logic function of the circuit. Extension of an n-input complementary CMOS structure to an (n+2)-input GDI cell is done by introducing an input P instead of supply voltage in the P-block of the CMOS structure and an input N instead of ground in the N-block (see FIG. 1b).

Thus, when a graft logic circuit based on GDI architecture is created, the resulting logic function is extended to the more general case of a logic circuit with inputs N and P as roots.

An example of such an extension for a homogeneous graft is now presented. An equivalent analysis may be performed for nonhomogeneous grafts. For a homogeneous graft, the new logic function created is represented for an N-graft by the following expressions (given the inverted graft inputs):

$$N \to N \text{ graft} \to Z_{NN} = P*[graft' * F(graft' = 1)] + \qquad (5)$$
$$N*[graft' * F(graft' = 1)]$$
$$= P*[graft' * F(graft' = 1)] +$$
$$N*[\text{graft} + F'(graft' = 1)]$$

where $Z_{NN}$ is the new output, F is the original output logic function, and an apostrophe (') indicates inversion (i.e. graft' is equivalent to $\overline{\text{graft}}$).

For a P-graft the resulting logic function (given inverted graft inputs) is given by:

$$P \to P \text{ graft} \to Z_{PP} = P*[graft' + F(graft' = 0)] + \qquad (6)$$
$$N*[graft' + F(graft' = 0)]$$
$$= P*[graft' + F(graft' = 0)] +$$
$$N*[\text{graft}*F'(graft' = 0)]$$

where $Z_{PP}$ is the new output and F is the original output logic function.

FIGS. 7a and 7b are circuit diagrams of examples of single-transistor homogeneous grafts in GDI structures (for N→N and P→P grafts respectively), according to preferred embodiments of the present invention. FIGS. 7a and 7b are seen to parallel the examples of FIGS. 4a and 4b in GDI architecture.

In the case of logic circuit 7a, the original CMOS logic function (see FIG. 4a) is F=$\overline{A}$+$\overline{B}$ (where N=Gnd i.e. a logic '0'). The GDI logic function for the N graft is given by equation (5):

$$Z_{NN}=1*[A*\overline{B}]+N*[\overline{A}+B]=A*\overline{B}+N$$

where graft=$\overline{A}$, $\overline{\text{graft}}$=A, F($\overline{\text{graft}}$=1)=$\overline{B}$, and P=1.

In the case of logic circuit 7b, the original CMOS function (see FIG. 4b) is F=A'*B', (where P=Vdd i.e. a logic '1'). The GDI logic function for the P graft is given by equation (6):

$$Z_{PP}=P*[A+\overline{B}]+0*[\overline{A}*B]=P*(A+\overline{B})$$

where graft=$\overline{A}$, $\overline{\text{graft}}$=A, F($\overline{\text{graft}}$=0)=$\overline{B}$, and N=0.

Reference is now made to FIG. 8, which is a circuit diagram of a homogeneous P-graft GDI logic circuit, according to a preferred embodiment of the present invention. In FIG. 8, the homogeneous graft is applied to a general GDI cell where both roots are replaced with diffusion logic inputs.

In the original CMOS function, where P=Vdd ('1') and N=Gnd ('0'), the output function is F=A'*B'. The GDI logic function for the P graft is given by equation (6):

$$Z_{PP}=P*[A+\overline{B}]+N*[\overline{A}*B]$$

where graft=$\overline{A}$, $\overline{\text{graft}}$=A, and F($\overline{\text{graft}}$=0)=$\overline{B}$.

The application of the graft logic technique to logic circuits to a GDI logic circuit having diffusion logic inputs allows further optimization and design of highly compact logic circuits. These circuits provide high functionality with a relatively small number of transistors.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

EXAMPLE

Reference is now made to the following example, which together with the above descriptions, illustrate the invention in a non-limiting fashion.

The following demonstrates that Graft Logic design, with its ability to implement complex new functions using a few additional transistors, is an effective technique for designing logic structures with multiple correlated outputs. Reference is now made to FIG. 9, which is a circuit design of a 2-input look-up table (LUT), based on Graft Logic design. The 2-input LUT was implemented with 12 outputs using only 26 transistors (or 24 if certain function reordering is performed) instead of the 32 transistors required by standard CMOS design. The Graft Logic implementation can be done with either homogeneous or nonhomogeneous graft blocks.

In order to demonstrate the effectiveness of the Graft logic technique, a comparison was performed analyzing Graft Logic implementation of 2-input LUT together with CMOS and CPL designs of the circuit.

The prior art design of a LUT using CPL (Complementary Pass Logic) is presented in FIG. 10*a*. FIGS. 10*b* and 10*c* show the explicit structure of the CPL XOR and AND circuits. CPL is considered as one of the most advantageous Pass-Transistor techniques. FIG. 11 is the circuit diagram of an additional prior art LUT circuit, which was implemented in a standard complementary CMOS design.

The device under test (DUT) was placed in a test environment which emulated various supply and load conditions. The outputs of the LUT were connected to changeable load, containing 2 types of circuits: inverters with adjustable gate sizes varying from 1 to 10 times the minimal size in each technology, and a digital flip-flop (DFF) that was used for verification of immunity of Graft Logic to active load consuming current from the output node.

The input signals to the DUT were passed through buffer elements in order to achieve more realistic signal shape. The circuits operated at a frequency of 100 Mhz. The structure of the test setup is shown in FIG. 12.

All the circuits were simulated using Spice models in 0.18, 0.25, 0.35 µm technologies. In each technology the designs were tested at nominal and reduced supply voltage. Four different load conditions were used, while the power consumption and the delay of the circuits were measured. Finally, performance metrics were derived for each of the cases based on power-delay products.

The results of the simulations are shown in Tables 1 to 3 below, for 0.18, 0.25, and 0.35 µm technologies respectively. Table 4 shows a comparison of the performance of the various technologies. In tables 1-4, the best results obtained are given in bold, while second best results are in italics. Missing values in the table indicate that the circuit did not operate at a required frequency.

TABLE 1

0.18 µm technology

| | Vdd = 1.8 V | | | | Vdd = 1.5V | | | |
| --- | --- | --- | --- | --- | --- | --- | --- | --- |
| | a = 1 | a = 5 | a = 10 | DFF | a = 1 | a = 5 | a = 10 | DFF |
| Power*Delay | | | | | | | | |
| Graft | *15.132* | *51.952* | *127.09* | 20.364 | 11.289 | *38.734* | *88.861* | 17.111 |
| CPL | 13.667 | 25.539 | 41.652 | *20.857* | *12.495* | 20.336 | 33.811 | *18.374* |
| CMOS | 15.251 | 57.877 | 156.55 | 28.125 | 12.853 | 51.808 | 134.63 | 21.267 |
| Power | | | | | | | | |
| Graft | 52.18 | *76.40* | 107.7 | 61.71 | *30.51* | *45.04* | 60.45 | *40.74* |
| CPL | 50.62 | 77.39 | 106.8 | 74.49 | 35.70 | 49.60 | 70.44 | 51.04 |
| CMOS | 41.22 | 62.91 | 95.46 | *63.92* | 26.23 | 42.12 | *62.33* | 37.31 |
| Delay | | | | | | | | |
| Graft | *0.29* | *0.68* | *1.18* | *0.33* | *0.37* | *0.86* | *1.47* | *0.42* |
| CPL | 0.27 | 0.33 | 0.39 | 0.28 | 0.35 | 0.41 | 0.48 | 0.36 |
| CMOS | 0.37 | 0.92 | 1.64 | 0.44 | 0.49 | 1.23 | 2.16 | 0.57 |

TABLE 2

0.25 µm technology

| | Vdd = 2.5 V | | | | Vdd = 1.8 V | | | |
| --- | --- | --- | --- | --- | --- | --- | --- | --- |
| | a = 1 | a = 5 | a = 10 | DFF | a = 1 | a = 5 | a = 10 | DFF |
| Power*Delay | | | | | | | | |
| Graft | 63.042 | 236.94 | 624.94 | 73.696 | 40.459 | *151.55* | *354.20* | 47.684 |
| CPL | 91.280 | 155.04 | 246.40 | 109.03 | 64.542 | 107.94 | 165.88 | 74.656 |
| CMOS | *72.702* | 327.20 | 883.63 | *88.389* | *55.363* | 222.09 | 565.40 | *73.760* |

TABLE 2-continued

| | 0.25 μm technology | | | | | | | |
|---|---|---|---|---|---|---|---|---|
| | Vdd = 2.5 V | | | | Vdd = 1.8 V | | | |
| | a = 1 | a = 5 | a = 10 | DFF | a = 1 | a = 5 | a = 10 | DFF |
| Power | | | | | | | | |
| Graft | *110.6* | *179.5* | 272.9 | 150.4 | 49.34 | 83.27 | 115.0 | *68.12* |
| CPL | 163.0 | 228.0 | 308.0 | 201.9 | 78.71 | 112.4 | 150.8 | 93.32 |
| CMOS | 95.66 | 178.8 | *277.0* | 140.3 | *50.33* | *85.75* | 128.5 | 66.45 |
| Delay | | | | | | | | |
| Graft | *0.57* | *1.32* | *2.29* | 0.49 | 0.82 | *1.82* | *3.08* | 0.70 |
| CPL | 0.56 | 0.68 | 0.80 | *0.54* | *0.82* | 0.96 | 1.10 | *0.80* |
| CMOS | 0.76 | 1.83 | 3.19 | 0.63 | 1.10 | 2.59 | 4.40 | 1.11 |

TABLE 3

| | 0.35 μm technology | | | | | | | |
|---|---|---|---|---|---|---|---|---|
| | Vdd = 3.3 V | | | | Vdd = 2.5 V | | | |
| | a = 1 | a = 5 | a = 10 | DFF | a = 1 | a = 5 | a = 10 | DFF |
| Power*Delay | | | | | | | | |
| Graft | 148.96 | *584.02* | 1502.1 | 203.35 | 109.40 | *373.97* | *857.44* | 148.68 |
| CPL | 255.92 | 404.40 | 601.22 | 319.17 | 187.22 | 297.12 | 425.00 | 224.95 |
| CMOS | *189.72* | 672.38 | *1431.1* | *225.25* | *129.27* | 477.20 | 1113.4 | *165.30* |
| Power | | | | | | | | |
| Graft | 196.0 | *328.1* | 490.9 | 290.5 | 109.4 | 176.4 | 242.9 | 154.4 |
| CPL | 328.0 | 444.4 | 578.1 | 414.5 | 178.3 | 247.6 | 312.5 | 216.3 |
| CMOS | *204.0* | 326.4 | 413.6 | 265.0 | 105.1 | *179.4* | 254.2 | 145.0 |
| Delay | | | | | | | | |
| Graft | 0.76 | *1.78* | *3.06* | 0.70 | 1.00 | *2.12* | *3.53* | 0.95 |
| CPL | *0.78* | 0.91 | 1.04 | *0.77* | *1.05* | 1.20 | 1.36 | *1.04* |
| CMOS | 0.93 | 2.06 | 3.46 | 0.85 | 1.23 | 2.66 | 4.38 | 1.14 |

TABLE 4

Overall comparison of Graft Logic, CMOS and CPL

| | Graft | CPL | CMOS |
|---|---|---|---|
| Area (# of transistors) | 24 | 54 | 32 |

| | Power*Delay*Area | | | | | | | |
|---|---|---|---|---|---|---|---|---|
| | 0.18 μm | | | | | | | |
| | Vdd = 1.8 V | | | | Vdd = 1.5 V | | | |
| | a = 1 | a = 5 | a = 10 | DFF | a = 1 | a = 5 | a = 10 | DFF |
| Graft | 363.17 | 1246.8 | *3050.1* | 488.7 | 270.93 | 929.62 | *2123.7* | 410.65 |
| CPL | 738.04 | *1379.1* | 2249.2 | 1126.3 | 674.73 | *1098.1* | 1825.8 | 992.22 |
| CMOS | *488.04* | 1852.1 | 5009.7 | *899.9* | *411.29* | 1657.8 | 4308.2 | *680.53* |

| | 0.25 μm | | | | | | | |
|---|---|---|---|---|---|---|---|---|
| | Vdd = 2.5 V | | | | Vdd = 1.8 V | | | |
| | a = 1 | a = 5 | a = 10 | DFF | a = 1 | a = 5 | a = 10 | DFF |
| Graft | 1513.0 | 5686.6 | *14999* | 1768.7 | 971.01 | 3637.2 | 8500.8 | 1144.4 |
| CPL | 4929.1 | *8372.2* | 13305 | 5887.4 | 3485.3 | *5826.8* | 8957.5 | 4031.4 |
| CMOS | *2326.4* | 10470 | 28276 | *2828.4* | *1771.6* | 7106.9 | 18093 | *2360.3* |

TABLE 4-continued

Overall comparison of Graft Logic, CMOS and CPL

| | 0.35 μm | | | | | | | |
|---|---|---|---|---|---|---|---|---|
| | Vdd = 3.3 V | | | | Vdd = 2.5 V | | | |
| | a = 1 | a = 5 | a = 10 | DFF | a = 1 | a = 5 | a = 10 | DFF |
| Graft | 3575.0 | 14016 | *36051* | 4880.4 | 2625.6 | 8975.2 | 20578 | 3520.3 |
| CPL | 13819 | 21837 | 32466 | 17234 | 10109 | 16044 | *22950* | 12147 |
| CMOS | *6071.0* | *21516* | 45793 | *7208.0* | *4136.7* | *15270* | 35628 | *5289.6* |

The results of Tables 1 to 4 demonstrate that Graft Logic design manifests robust operation under various supply and load conditions in different fabrication technologies. Almost in all the parameters the results of Graft Logic are superior or second among the compared techniques. When an overall comparison performed, accounting for both the performance and the area consumption of the designs, Graft Logic appears to be the best in the majority of cases.

The simulations of Graft Logic implementation of a LUT demonstrate robust operation under different fabrication technologies and environmental conditions. Graft Logic manifested superiority among the compared CMOS and CPL design techniques.

The Graft Logic design technique discussed above allows the implementation of multiple complex logic functions on the basis of a single given CMOS design structure. The logic functions are implemented by the addition of a small number of transistors into intermediate nodes of the original CMOS structure. The original logic function at the central node is not influenced by the addition of the graft network. Output buffers or keepers can be used as an effective measure against Vt drops at the output in some cases, and to prevent the creation of new signal passes in the transistor structure, in which the load of one output influences another output.

The low area and transistor count of the Graft Logic, together with the simple methodology for automatic design and expected power reduction, make Graft Logic design an efficient improvement of standard logic design. Various logic systems, as decoders, FPGA blocks and adders can be efficiently implemented using Graft Logic. Closed-form expressions allow development of CAD tools for Graft Logic design, to allow integration of the new technique into a general high-performance design toolbox.

It is expected that during the life of this patent many relevant logic circuits, complementary logic circuit designs, logic gates, transistors, and transistor technologies will be developed and the scope of the terms logic circuit, complementary logic circuit designs, logic gate, transistor, and transistor technology is intended to include all such new technologies a priori.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A logic circuit comprising:
   a first transistor network and a complementary second transistor network, connected at a central node to provide a first logic output, each of said first and said second transistor networks being further connected to a respective root;
   a third transistor network connected between an intermediate node of a given one of said transistor networks and the respective root of said given transistor network, said third transistor network having a complementary structure to the transistors between said intermediate node and said central node, being of the opposite transistor type as said given transistor network, and having equivalent inputs relative to said transistors between said intermediate node and said central node, thereby to provide a second logic output.

2. A logic circuit according to claim 1, wherein said transistor types comprise p-type and n-type, a root of a p-type transistor network comprises a high voltage and a root of an n-type transistor network comprises a low voltage.

3. A logic circuit according to claim 1, wherein said transistor types comprise p-type and n-type, a root of a p-type transistor network comprises a positive supply voltage and a root of an n-type transistor network comprises one of a negative supply voltage or ground.

4. A logic circuit according to claim 1, wherein said roots comprise logic inputs.

5. A logic circuit according to claim 1, wherein each of said transistor networks comprises an arrangement of complementary metal oxide semiconductor (CMOS) transistors.

6. A logic circuit according to claim 5, wherein a manufacturing technology of said CMOS transistors is one of a group consisting of: p-well, n-well, and twin-well.

7. A logic circuit according to claim 1, wherein each of said transistor networks comprises an arrangement of silicon on insulator (SOI) transistors.

8. A logic circuit according to claim 1, wherein each of said transistor networks comprises an arrangement of silicon on sapphire (SOS) transistors.

9. A logic circuit according to claim 1, wherein each of said transistor networks comprises an arrangement of field effect transistors (FET).

10. A logic circuit according to claim 1, wherein each of said transistor networks comprises an arrangement of bipolar transistors.

11. A logic circuit according to claim 1, wherein said first transistor network comprises a network of p-type transistors and said second transistor network comprises a network of n-type transistors.

12. A logic circuit according to claim 1, wherein each of said first transistor network and said second transistor network comprises a single transistor.

13. A logic circuit according to claim 1, wherein said third transistor network comprises a single transistor.

14. A logic circuit according to claim 1, further comprising at least one buffer element to preserve signal characteristics.

15. A logic circuit according to claim 1, further comprising at least one inverter.

16. A logic circuit according to claim 1, further comprising a fourth transistor network connected between a node of said third transistor network and the root of said given transistor network, said fourth transistor network having a complementary structure to the transistors between said node of said third transistor network and said second logic output, being of the opposite transistor type as said third transistor network, and having equivalent inputs relative to said transistors between said node of said third transistor network and said second logic output, thereby to provide a third logic output.

17. A logic circuit according to claim 1, further comprising a fourth transistor network connected between a node of said third transistor network and the root of said given transistor network, said fourth transistor network having a complementary structure to the transistors between said node of said third transistor network and said second logic output, being of the same transistor type as said third transistor network, and having inverted inputs relative to said transistors between said node of said third transistor network and said second logic output, thereby to provide a third logic output.

18. A logic circuit comprising:
a first transistor network and a complementary second transistor network, connected at a central node to provide a first logic output, each of said first and said second transistor networks being further connected to a respective root;
a third transistor network connected between an intermediate node of a given one of said transistor networks and the respective root of said given transistor network, said third transistor network having a complementary structure to the transistors between said intermediate node and said central node, being of the same transistor type as said given transistor network, and having inverted inputs relative to said transistors between said intermediate node and said central node, thereby to provide a second logic output.

19. A logic circuit according to claim 18, wherein said transistor types comprise p-type and n-type, a root of a p-type transistor network comprises a high voltage and a root of an n-type transistor network comprises a low voltage.

20. A logic circuit according to claim 18, wherein said transistor types comprise p-type and n-type, a root of a p-type transistor network comprises a positive supply voltage and a root of an n-type transistor network comprises one of a negative supply voltage or ground.

21. A logic circuit according to claim 18, wherein said roots comprise logic inputs.

22. A logic circuit according to claim 18, wherein a type of transistor forming said transistor networks is one of a group consisting of: field effect transistors (FET), p-well complementary metal-oxide semiconductor (CMOS), n-well complementary metal-oxide semiconductor (CMOS), network of p-type twin-well complementary metal-oxide semiconductor (CMOS), silicon on insulator (SOI) transistors, silicon on sapphire (SOS) transistors, and bipolar transistors.

23. A logic circuit according to claim 18, wherein each of said first transistor network and said second transistor network comprises a single transistor.

24. A logic circuit according to claim 18, wherein said third transistor network comprises a single transistor.

25. A logic circuit according to claim 18, further comprising a fourth transistor network connected between a node of said third transistor network and the root of said given transistor network, said fourth transistor network having a complementary structure to the transistors between said node of said third transistor network and said second logic output, being of the same transistor type as said third transistor network, and having inverted inputs relative to said transistors between said node of said third transistor network and said second logic output, thereby to provide a third logic output.

26. A logic circuit according to claim 18, further comprising a fourth transistor network connected between a node of said third transistor network and the root of said given transistor network, said fourth transistor network having a complementary structure to the transistors between said node of said third transistor network and said second logic output, being of the opposite transistor type as said third transistor network, and having equivalent inputs relative to said transistors between said node of said third transistor network and said second logic output, thereby to provide a third logic output.

* * * * *